United States Patent [19]
Brooks

[11] Patent Number: 5,196,743
[45] Date of Patent: Mar. 23, 1993

[54] LOW-POWER CLOCKING CIRCUITS

[75] Inventor: David R. Brooks, Perth, Australia

[73] Assignee: Magellan Corporation (Australia) Pty. Ltd., Australia

[21] Appl. No.: 459,761

[22] PCT Filed: May 4, 1989

[86] PCT No.: PCT/AU89/00192
§ 371 Date: Jan. 12, 1990
§ 102(e) Date: Jan. 12, 1990

[87] PCT Pub. No.: WO89/11182
PCT Pub. Date: Nov. 16, 1989

[51] Int. Cl.[5] ...................... H03K 17/16; H03K 19/20
[52] U.S. Cl. .................................... 307/443; 307/452; 307/481
[58] Field of Search ............... 307/452, 481, 443, 269, 307/296.1; 323/239, 244

[56] References Cited

U.S. PATENT DOCUMENTS

| 4,306,138 | 12/1981 | Tokunaga et al. | 323/244 |
| 4,308,494 | 12/1981 | Gelfand et al. | 323/244 |
| 4,547,683 | 10/1985 | Bingham | 307/355 |
| 4,694,207 | 9/1987 | Heuwieser | 307/571 |
| 4,812,684 | 3/1989 | Yamagiwa et al. | 307/480 |
| 4,902,919 | 2/1990 | Spohrer et al. | 307/452 |
| 4,920,282 | 4/1990 | Muraoka et al. | 307/452 |
| 4,929,854 | 5/1990 | Iino et al. | 307/452 |
| 4,982,353 | 1/1991 | Jacob et al. | 307/443 |

Primary Examiner—Edward P. Westin
Assistant Examiner—Andrew Sanders
Attorney, Agent, or Firm—Learman & McCulloch

[57] ABSTRACT

In switching a CMOS circuit comprising first and second switchable logic elements the first logic element is enabled so as to allow it to reach a steady logic state and the second logic element is not enabled until the first logic element reaches a substantially steady logic state. The current drawn by the circuit at any time is thereby reduced.

9 Claims, 2 Drawing Sheets

LOW-POWER CLOCKING CIRCUITS

FIELD OF INVENTION

The present invention relates to the field of switching low power electronic circuits and particularly CMOS logic circuits. More particularly, the present invention relates to reducing or minimising the current drawn by a switchable electronic circuit at any point in time, such as CMOS circuitry.

BACKGROUND

The basic CMOS logic gate, as its known to those skilled in the art, consumes essentially no or a relatively small amount of power, except when it is actually in a switching state (a change in input causes the output to change). Circuits including CMOS logic gates often comprise a large number of such gates, synchronised to a single clock signal. Synchronous systems are preferred from a design standpoint, and their synchronous behaviour is believed to be well understood by people skilled in the art. All logic gates of such a circuit switch simultaneously, and the load presented to the power source appears as a short, heavy burst, synchronised with the clock. Compensation for this heavy power drain, as a result of current flowing simultaneously into these gates, often necessitates the use of a large supply reservoir capacitor in the power source. This large capacitor is often undesirable.

OBJECTS OF INVENTION

An object of the present invention is to provide a method and/or device wherein the current drawn by a circuit is distributed over a predetermined period of time.

A further object of the present invention is to provide a device and/or method which has a reduced dependence on a charge storage reservoir when switching a circuit comprising a relatively large number of CMOS gates.

SUMMARY OF INVENTION

The present invention provides a method of switching a circuit comprising a plurality of non or minimal power consumption logic elements, said circuit comprising at least a first switchable logic element and a second switchable logic element, the method comprising the steps of:

enabling said first logic element so as to allow said first logic element to reach a steady logic state, enabling said second logic element so as to allow said second logic element to reach a steady logic state, wherein:

enabling of said second element is not commenced until said first element reaches a substantially steady logic state.

The present invention also provides a device for switching a circuit comprising a plurality of non or minimal power consumption logic elements, said circuit comprising at least a first switchable element and a second switchable element, said device comprising:

a timing means coupled to said first element and being adapted to enable said first element so as to allow said first element to reach a steady logic state, said timing means further being coupled to said second element and being adapted to enable said second element so as to allow said second element to reach a steady logic state, wherein said timing means enables the second element after the first element reaches a substantially steady logic state.

The present invention also provides a method and device as described above, wherein the enabling of each element is co-ordinated with successive cycles of an AC power source.

The present invention also provides a method and device as described above, wherein high switching currents are drawn directly form an AC power source.

The present invention also provides a method and device as described above, wherein enabling of each circuit or part thereof is provided in a staggered relationship.

The present invention also provides a method and device as described above, wherein, within each element, gates or groups of gates are further selectively enabled in a staggered relationship.

The above methods or device(s) may be included in a clocking circuit. The timing means of the device may also incorporate delay elements to enhance device timing.

The present invention may be applicable to I.C. circuits, or other low current drawing circuit, including passive transponders.

DISCLOSURE OF INVENTION

The present invention discloses tow arrangements and methods which may be incorporated in a switchable circuit. The circuit may include groups of circuit elements or sub-groups thereof (gates), each of which can be individually switched when desired. The present invention deals with clocking a circuit in a particular way to reduce the energy storage requirements of a power supply storage capacitor. One arrangement has a general application, while the other arrangement is usable where the circuit is powered from a rectified AC source, having a frequency equal to an exact even multiple of a clock source.

Either or both arrangements may be used in any given application.

One arrangement may be termed "Staggered Clocks". This arrangement serves to cause successive sections of the circuit to switch at different times, thereby "evening out" the load or current drawn on the power supply. The staggered clocks arrangement will be described with reference to a 2-phase clocking scheme, however, it may be extended to polyphase clocks. This arrangement essentially trades speed for power. Therefore, it is of more use where low processing speed is desirable.

Figure 1:
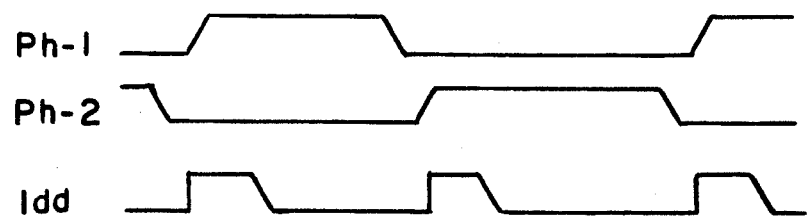
FIG. 1 is a schematic view of a 2-phase clocking circuit according to the invention.

A 2-phase clocking scheme is shown in FIG. 1. The two clock phases, Ph-1 and Ph-2 enable or switch alternate sections of the logic. All elements or gates activated by Ph-1 are enabled, and allowed to reach their final values, before Ph-1 terminates. At this point, the newly-determined values are retained. Ph-2 then becomes active, and the new values are used in the second section of the logic, to evaluate further results, which may in turn serve as inputs to the Ph-1 logic on the next occurrence of Ph-1.

All clock phases must never be active simultaneously or else a "race" condition will result.

FIG. 1 shows that such a circuit will draw heavy load (Idd) from its supply at the start of each of the clock phases, as the clock lines change status, after which the circuits become steady state.

Figure 2:
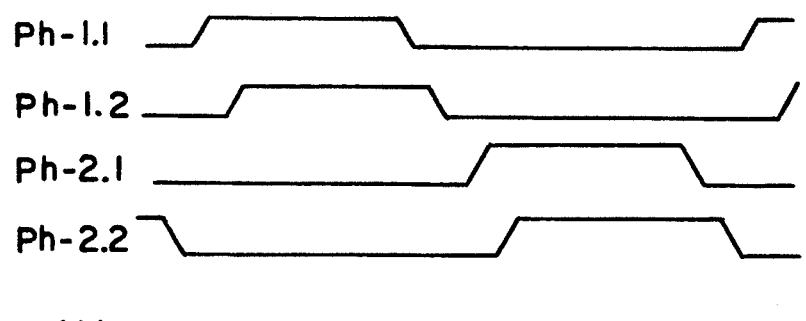
FIG. 2 is a schematic view of a modification of the circuit shown in FIG. 1.

To more evenly distribute the current drawn from the power supply by enabled circuit elements, an arrangement in accordance with the present invention and exemplified by that shown in FIG. 2 may be employed. Here the clocks have been divided into two sections each (more sections may be used if desired). these sub-clocks are displaced in time, and accordingly, spreading-out current drawn form the power supply, as shown. It is of an advantage if clock Ph-1.2 did not change status until clock Ph-1.1 had stabilised. Coincident clocks will only serve to reduce the effect of the present invention.

To ensure correct circuit functioning, all the Ph-1 clocks must be simultaneously active long enough for the circuits to reach steady logic states, and all Ph-1 clocks must be inactive before the first Ph-2 clock becomes active. A similar rule holds for the Ph-2 clocks.

If the clocks are obtained by division from a high-frequency source, the staggered clock may be obtained by conventional digital means (e.g. shift registers).

If such a high frequency source is not available, a chain of delay elements, such as ring-oscillator stages, may serve to stagger the clocks. In the case of VLSI, a further arrangement may be used by distributing the clock in polysilicon, deliberately exploiting the high distributed resistance and capacitance of that medium, in order to create desired staggered delays.

In each case, the latest (most delayed) of the sub-clocks may be used to initiate the next switching-phase, to ensure there is not overlap.

Another arrangement relies on a Rectified AC Power Source. DC operating power can be obtained from a rectified AC power source of sufficiently low internal impedance, and provided the AC frequency is equal to an exact even multiple of the clock frequency. (As before, we here consider a 2-phase clocking scheme. In the general case, with N clock phases, the AC power frequency must equal (N x M x the clock frequency)/C, where M and C are both integers, N as stated is the number of clock phases, C is the number of rectifier conduction "events" per AC cycle (on for half wave, two for full wave, etc.) and M is any number not less than one).

This arrangement utilises a concept wherein to phase-lock the clocks to the AC waveform, each clock commences its active edge just as (or shortly after) the power rectifier begins to conduct. In essence, the heavy current pulse required to activate the logic, is drawn directly form the AC supply, rather than from a DC reservoir capacitor.

Figure 3:
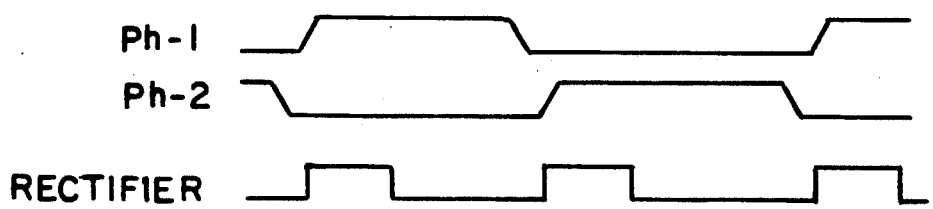
FIG. 3 is a schematic view of another modification of the circuit shown in FIG. 1.
Figure 4:
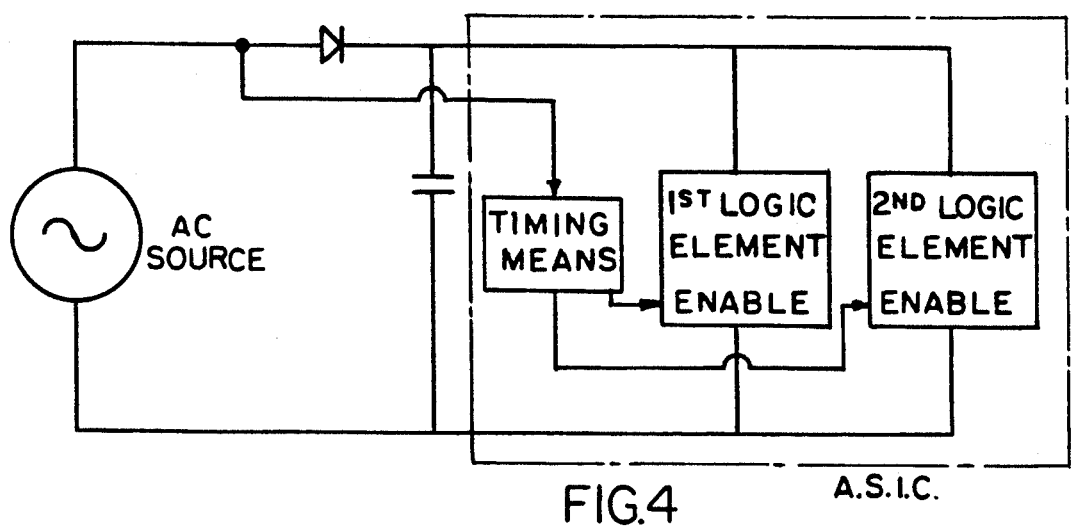
FIG. 4 is a schematic view of a complete circuit in which the invention is adapted for use.

FIGS. 3 and 4 show an example of a half-wave rectifier, and a 2-phase clock using this arrangement, the timing means to co-ordinate circuit clocking being incorporated in the ASIC.

FIG. 3 shows the clock waveforms, together with the conduction angle of the supply rectifier. Comparison of this diagram with the schematic in FIG. 4 will show that the heavy current pulses of FIG. 1 are now supplied directly via the rectifier, while the reservoir capacitor is required merely to sustain the DC rail during the remainder of a clock period. Accordingly, the capacitor can be of a much smaller size.

This device may be especially useful in devices which are powered by AC magnetic induction, using a resonant power pickup circuit, such as those used in passive transponder devices, and disclosed in copending PCT Application Nos. PCT/AU88/00449 entitled "TRANSPONDER" and PCT/AU88/00476 entitled "POWERING AND COMMUNICATION APPARATUS AND METHOD". In such cases (assuming a moderate Q-factor in the tuned circuit), the rectifier merely 'taps into' the comparatively large circulating currents in the tuned circuit at the appropriate times when the rectifier is conducting to obtain the current pulses required during switching of the circuit.elements and gates.

I claim:

1. A method of switching a circuit comprising a plurality of non or minimal power consumption logic elements, said circuit comprising at least a first switchable CMOS logic element and a second switchable CMOS logic element, the method comprising the steps of:
    enabling said first logic element to allow said first logic element to reach a steady logic state, and
    enabling said second logic element when said first logic element reaches a substantially steady logic state,
    the enabling of each element being substantially coordinated with cycles of an AC power source.

2. A method as claimed in claim 1 wherein each enabling step substantially corresponds to a peak of said AC cycles.

3. A method as claimed in claim 1 wherein said power source includes a tuned circuit and a storage capacitor coupled thereto.

4. A method as claimed in claim 1 wherein high switching currents are drawn directly form the AC power source.

5. A method as claimed in claim 1 wherein enabling of each circuit is provided by staggered clocks.

6. A method as claimed in claim 5 wherein, within each element, a selected number of gates is selectively enabled in a staggered relationship.

7. A device for switching a circuit comprising a plurality of non or minimal power consumption logic elements, said circuit comprising at least a first switchable CMOS logic element and a second switchable CMOS logic element, said device comprising:
    timing means coupled to said first element for enabling said first element to reach a steady logic state, said timing means further being coupled to said second element for enabling said second element to reach a steady logic state when the first element reaches a substantially steady logic state, and means for coupling each of said elements to an AC power source, the enabling of each element being substantially coordinated with cycles of an AC power source.

8. A device as claimed in claim 7 wherein said timing means comprises a polyphase clock for staggering circuit switching.

9. A device as claimed in claim 7 wherein said timing means is phase-locked to an Ac power waveform to enable each element at substantially a peak of said AC cycles.

* * * * *